United States Patent
Yutani

(10) Patent No.: US 7,880,763 B2
(45) Date of Patent: Feb. 1, 2011

(54) SEMICONDUCTOR DEVICE AND MANUFACTURING METHOD THEREFOR

(75) Inventor: Naoki Yutani, Chiyoda-ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 127 days.

(21) Appl. No.: 12/201,764

(22) Filed: Aug. 29, 2008

(65) Prior Publication Data

US 2009/0004761 A1    Jan. 1, 2009

Related U.S. Application Data

(62) Division of application No. 11/282,600, filed on Nov. 21, 2005, now abandoned.

(30) Foreign Application Priority Data

Dec. 14, 2004    (JP) ............... 2004-361477

(51) Int. Cl.
*G01R 31/26* (2006.01)
*H01L 21/66* (2006.01)

(52) U.S. Cl. .......... 348/15; 438/113; 438/197; 438/460; 438/570; 438/613; 438/666; 438/675; 438/687; 438/931; 438/942; 257/77; 257/288; 257/471; 257/690; 257/738; 257/762; 257/774; 257/778; 257/E27.051; 257/E27.06; 257/E27.073; 257/E27.081; 257/E23.021

(58) Field of Classification Search .............. None
See application file for complete search history.

(56) References Cited

U.S. PATENT DOCUMENTS

| | | | |
|---|---|---|---|
| 5,597,737 A | 1/1997 | Greer et al. | |
| 6,075,279 A | 6/2000 | Andoh | |
| 6,213,356 B1 | 4/2001 | Nakasu et al. | |
| 6,281,064 B1 | 8/2001 | Mandelman et al. | |
| 6,392,143 B1 | 5/2002 | Koshio | |
| 6,514,779 B1 | 2/2003 | Ryu | |

(Continued)

FOREIGN PATENT DOCUMENTS

DE    60203054 T2    4/2006

(Continued)

*Primary Examiner*—Hoang-Quan T Ho
(74) *Attorney, Agent, or Firm*—Oblon, Spivak, McClelland, Maier & Neustadt, L.L.P.

(57) ABSTRACT

A semiconductor device is obtained, in which excellent characteristics are achieved, the reliability is improved, and an SiC wafer can also be used for the fabrication. A plurality of Schottky-barrier-diode units 10 is formed on an SiC chip 9, and each of the units 10 has an external output electrode 4 independently of each other. Bumps 11 (the diameter is from several tens to several hundreds of μm) are formed only on the external output electrodes 4 of non-defective units among the units 10 formed on the SiC chip 9, meanwhile bumps are not formed on the external output electrodes 4 of defective units in which the withstand voltage is too low, or the leakage current is too much. Because the bumps are not formed on the defective units, Schottky-barrier-side electrodes 3 are connected in parallel to the exterior of the device through the bumps 11, and a wiring layer 13 and an external lead 13*a* of a wiring substrate 12; thus, only the external output electrodes 4 of the non-defective units 10 are connected in parallel with each other.

8 Claims, 12 Drawing Sheets

U.S. PATENT DOCUMENTS

| | | |
|---|---|---|
| 7,230,273 B2 | 6/2007 | Kitabatake et al. |
| 2002/0102832 A1 | 8/2002 | Miyata et al. |
| 2004/0161865 A1 | 8/2004 | Yu et al. |
| 2005/0151268 A1 | 7/2005 | Boyd et al. |

FOREIGN PATENT DOCUMENTS

| | | |
|---|---|---|
| EP | 144729 B1 | 8/2004 |
| JP | 62-190360 | 12/1987 |
| JP | 63-38344 | 3/1988 |
| JP | 63-272058 | 11/1988 |
| JP | 10-22330 | 1/1998 |
| JP | 63-296248 | 10/1998 |
| JP | 63-272058 | * 11/1998 |
| JP | 2000-243835 | 9/2000 |
| JP | 2000-357749 | 12/2000 |
| JP | 2003-273313 | * 9/2003 |
| JP | 2004-111759 | * 4/2004 |
| JP | 2004-289103 | 10/2004 |

* cited by examiner

SEMICONDUCTOR DEVICE AND MANUFACTURING METHOD THEREFOR

CROSS-REFERENCE TO RELATED APPLICATIONS

This application is a Divisional of and claims the benefit of priority under 35 U.S.C. §120 from U.S. Ser. No. 11/282,600, filed Nov. 21, 2005, and claims the benefit of priority under 35 U.S.C. §119 from Japanese Patent Application No. 2004-361477, filed Dec. 14, 2004.

BACKGROUND OF THE INVENTION

1. Field of the Invention

The present invention relates to semiconductor devices, in which a plurality of semiconductor units is provided and non-defective ones are selectively connected among the plurality of semiconductor units, and relates to methods of manufacturing the same.

2. Description of the Related Art

Because semiconductor devices using SiC are more excellent in high-voltage, large-current, and high-temperature operations comparing to those using silicon, they have been developed for applying to electric-power semiconductor devices. However, because it is difficult to produce SiC wafers having less defects comparing to silicon wafers, large-current semiconductor devices that need a large semiconductor chip area are difficult to be obtained. Therefore, in an SiC wafer, a plurality of semiconductor units (hereinafter, simply referred to as units) such as Schottky diodes are formed to have an area in which a certain production yield can be secured, and segmentation is performed so as to configure a single SiC chip using the plurality of units. A method is disclosed in which, in the SiC chip, an insulation layer having apertures reaching Schottky barrier electrodes of the units is provided, so that the Schottky barrier electrodes of defective units among the plurality of units are insulated by coated insulator, and a metal layer provided through the insulation layer becomes external output electrodes and wiring layers of the units, so that only the Schottky barrier electrodes of non-defective units are connected in parallel with each other, to obtain a large-scale semiconductor device in high yield even though an SiC wafer having many defects is used (for example, referred to as Patent Document 1).

[Patent Document 1]

Japanese Laid-Open Patent Publication 111,759/2004 (on page 1).

SUMMARY OF THE INVENTION

However, if the wiring layer for connecting the non-defective units on the SiC chip in parallel is not deposited in a sufficient thickness such as not thinner than several dozen μm, resistive loss of the layer increases. Moreover, because the wiring layer is also formed on the insulation layer of the separator between the units, in order to keep the breakdown voltage high, deposition of the insulation layer must be formed to have a sufficient thickness such as not thinner than several dozen μm. However, because the thick insulation layer and wiring layer are provided on the SiC chip as described above, which increases mechanical and thermal stress, and as a resultant warpage of the SiC wafer increases; consequently, a problem has occurred in that manufacturing of the semiconductor device has become difficult, or the reliability of the semiconductor device has decreased. Moreover, generally, in manufacturing of semiconductor devices fabricated using silicon wafers, because manufacturing equipment for depositing and processing the wafers is optimized, from the viewpoint of micronization, in order to enable the deposition and the processing of a film thickness not more than several μm, a problem has occurred in that it is not easy to increase the wiring layer and insulation film thickness as described above.

An objective of the present invention, which is made to solve such problems, is to obtain a semiconductor device in which excellent characteristics are achieved and reliability is improved, and to obtain a semiconductor-device manufacturing method by which the above described semiconductor device can be easily obtained in high yield.

A semiconductor device according to a first aspect of the present invention includes: a plurality of semiconductor units formed on a semiconductor chip; external output electrodes formed, for each unit, independently of each other on the semiconductor units; bumps selectively formed on the external output electrodes of, among the semiconductor units as including non-defective and defective units, the non-defective semiconductor units; and a wiring substrate provided with a wiring layer electrically connected to the bumps.

A semiconductor device according to the first aspect of the present invention includes: a plurality of semiconductor units formed on a semiconductor chip; external output electrodes formed, for each unit, independently of each other, on the semiconductor units; bumps selectively formed on the external output electrodes of, among the semiconductor units as including non-defective and defective units, the non-defective semiconductor units; and a wiring substrate provided with a wiring layer electrically connected to the bumps; therefore, it is effective that not only excellent characteristics is achieved but also reliability is improved. Moreover, an SiC wafer can also be used as the semiconductor wafer, which brings about effects that not only excellent characteristics is achieved but also reliability is improved.

DETAILED DESCRIPTION OF THE PREFERRED EMBODIMENTS

Embodiment 1

Figure 1:
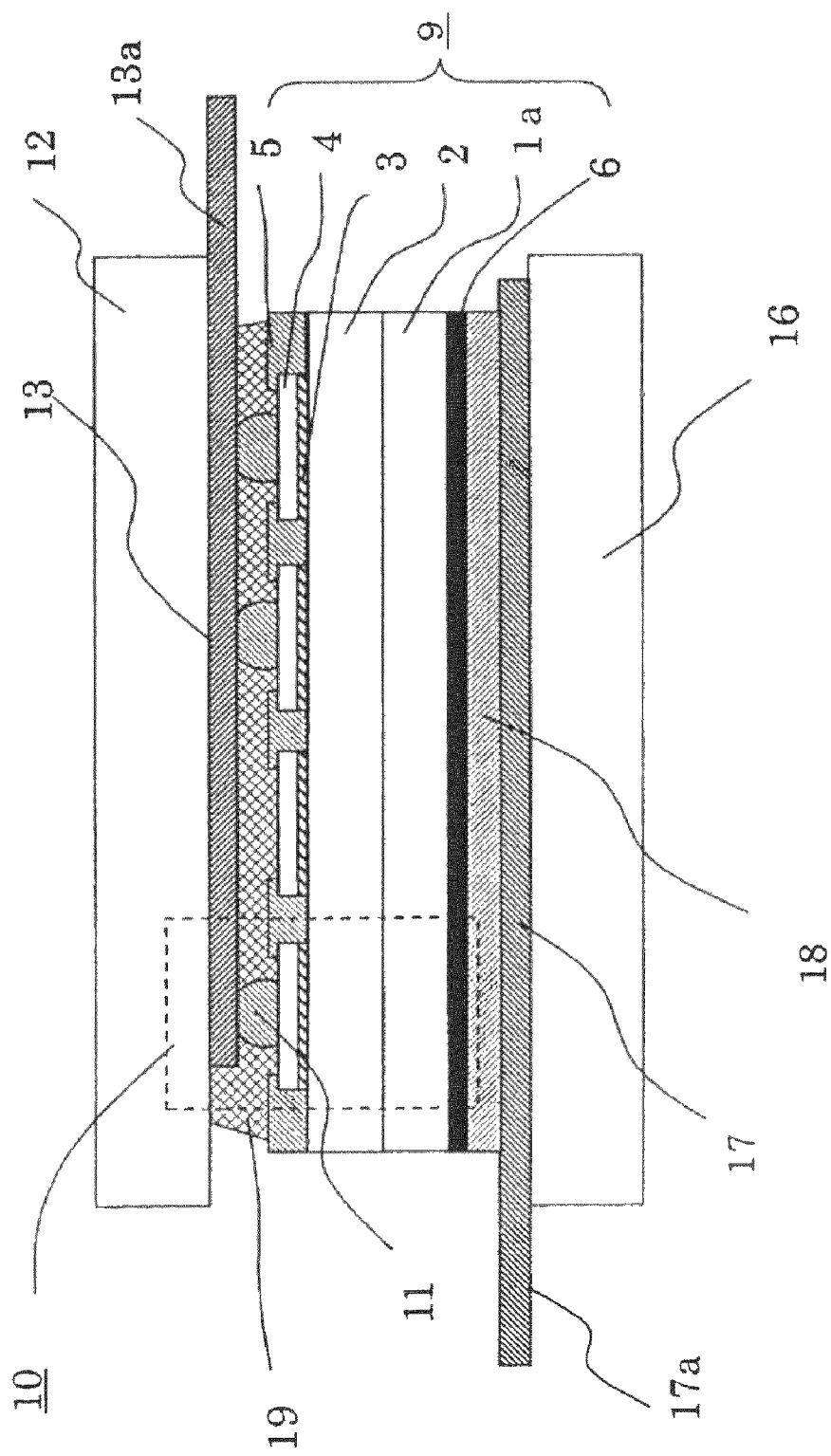
FIG. 1 is a cross-sectional view illustrating a semiconductor device according to Embodiment 1 of the present invention.

FIG. 1 is a cross-sectional view illustrating a semiconductor device according to Embodiment 1 of the present invention, in which on an SiC chip 9 as a semiconductor chip, a plurality of Schottky barrier diode units 10 is formed as semiconductor units, and the units 10 each have an independent external output electrode 4. Only on the external output electrodes 4 of non-defective units among the units 10 formed on the SiC chip 9, are formed bumps 11, whose diameters are from several dozen to several hundred μm, composed of, for example, molten metals (Sn—Pb, Sn—Ag, Sn—Cu, Sn—Bi, Sn—Ag—Cu, Sn—Sg—Bi, Sn—Ag—Bi—Cu, Au—Sn, etc.); meanwhile, bumps are not formed on the external output electrodes 4 of defective units having low withstand voltage, or high leakage current. Thus, because the bumps are not formed on the defective units, Shottky barrier side electrodes 3 are connected in parallel with each other, and to the exterior thereof passing through the external output electrodes 4, the bumps 11, and a wiring layer 13 and an external lead 13a of a wiring substrate 12, so that only the external output electrodes 4 of the non-defective units 10 are connected in parallel with each other. A gap between the wiring substrate 12 and the SiC chip 9 is filled with underfill resin 19, and the SiC chip 9 is fixed to a package substrate 16 using a die-bonding material 18 composed of molten-metal paste. The surface of a back face electrode 6 of the SiC chip 9 is composed of an Au layer so that the molten metal is easy to fit into the electrode; accordingly, after the die-bonding material 18 has been coated on a wiring layer 17 of the package substrate 16, the SiC chip 9 has been put on the die-bonding material, heating has been performed at a temperature of the melting point of the molten metal, and cooling has been performed, the molten-metal paste solidifies; consequently, the SiC chip 9 is fixed to the package substrate 16, and thus the back face electrode 6 is also electrically connected to the wiring layer 17 of the package substrate 16. The wiring layer 17 is connected to an external lead 17a, and thus the external lead 17a becomes the common semiconductor-side-electrode output of the Schottky barrier diodes of the non-defective units 10.

Figure 12:
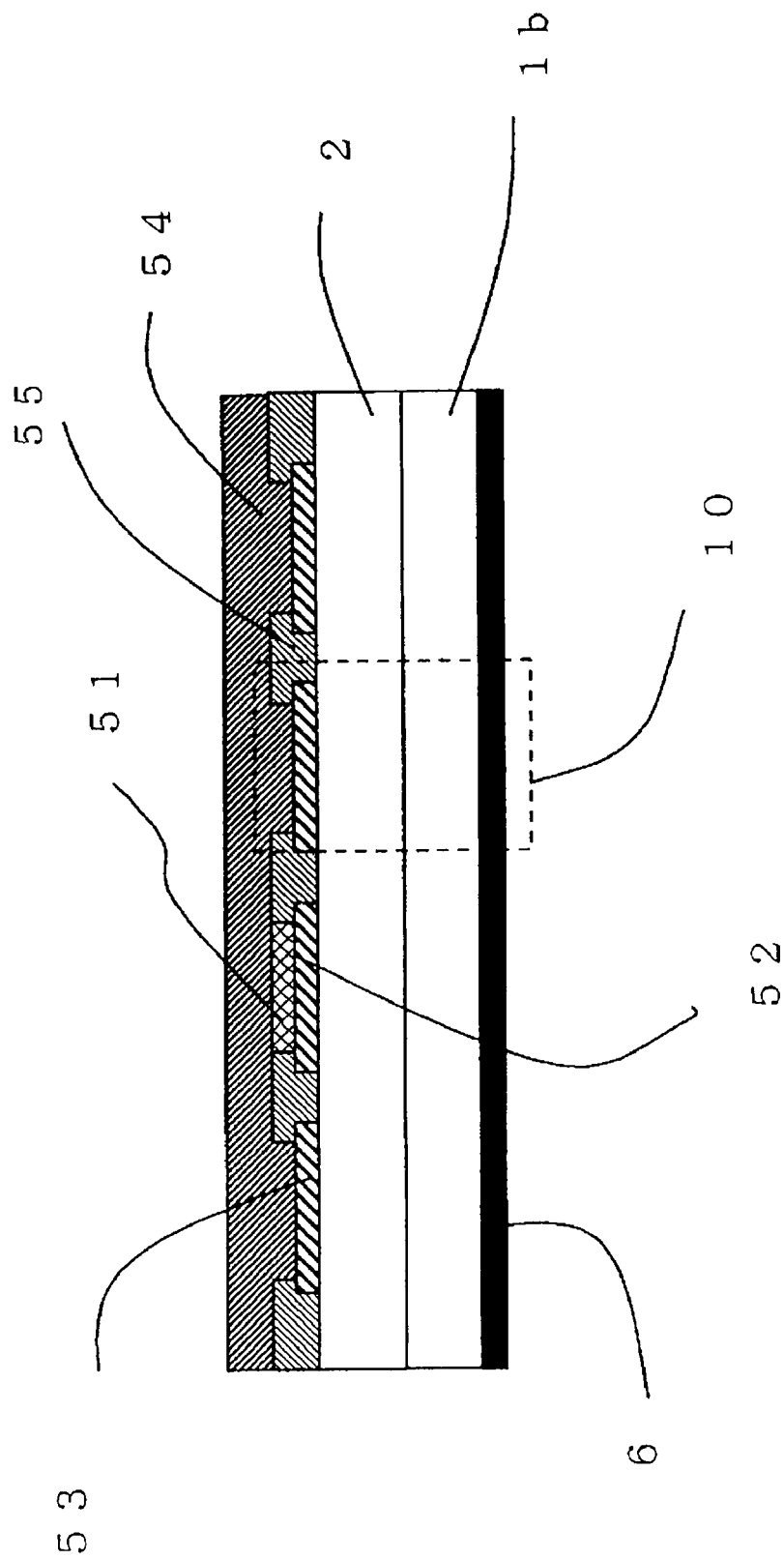
FIG. 12 is a cross-sectional view illustrating a conventional semiconductor device.

On the other hand, FIG. 12 is a cross-sectional view illustrating a conventional semiconductor device represented as a reference. That is, a chip is separated into a plurality of the units 10 inside the chip, and an insulating layer 55 having apertures reaching Schottky barrier electrodes 52 and 53 of the units 10 is provided on the chip. After an insulating material 51 has been applied onto the Schottky barrier electrodes 52 of the defective units among the plurality of units, so as to insulate the electrode, a metal layer 54 is provided on the insulating layers 55, so as to serve as an external output electrode and a wiring layer of the units 10; then, only the Schottky barrier electrodes 53 of the non-defective units are connected in parallel with each other using the wiring layer. Here, the metal layer 54 is also formed on the insulating layers 55 as separators between the units 10.

The SiC chip 9 represented in FIG. 1 according to the semiconductor device in this embodiment of the present invention can be obtained as described below. That is, an n-type SiC epitaxial layer 2 is deposited on an $n^+$-type SiC wafer 1a as a semiconductor wafer; next, a plurality of Shottky barrier electrodes 3 are formed by depositing and processing a metal such as Ti or Ni in several hundred nm on the layer, so as form the plurality of units 10 on the SiC wafer 1a. The external output electrodes 4 are formed by depositing and processing, for example, Al in a thickness of approximately 1 μm on the Schottky barrier electrodes 3. In a case in which an Au film is formed on the outmost surface of the external output electrodes so that the molten metal of the bumps is easy to fit into the electrodes, Cr—Ni—Au, etc. is further deposited. Moreover, for example, a polyimide film is deposited in a thickness of approximately several μm, which serves as a protection film 5 provided with apertures corresponding to only part of the external output electrodes 4, and on the back face of the $n^+$-type SiC wafer 1a, for example, nickel and gold are deposited as the back face electrode 6. Next, the external output electrodes 4 are used as metal-side output electrodes of the units 10, while the back face electrode 6 is used as a semiconductor-side output electrode; the units 10 inside the SiC wafer are judged, as described below, whether they are defective; an SiC-wafer unit is obtained by forming the bumps on the external output electrodes 4 of only non-defective units; and then, the wafer unit is segmented into the SiC chip 9 having the plurality of units 10.

Figure 2A:
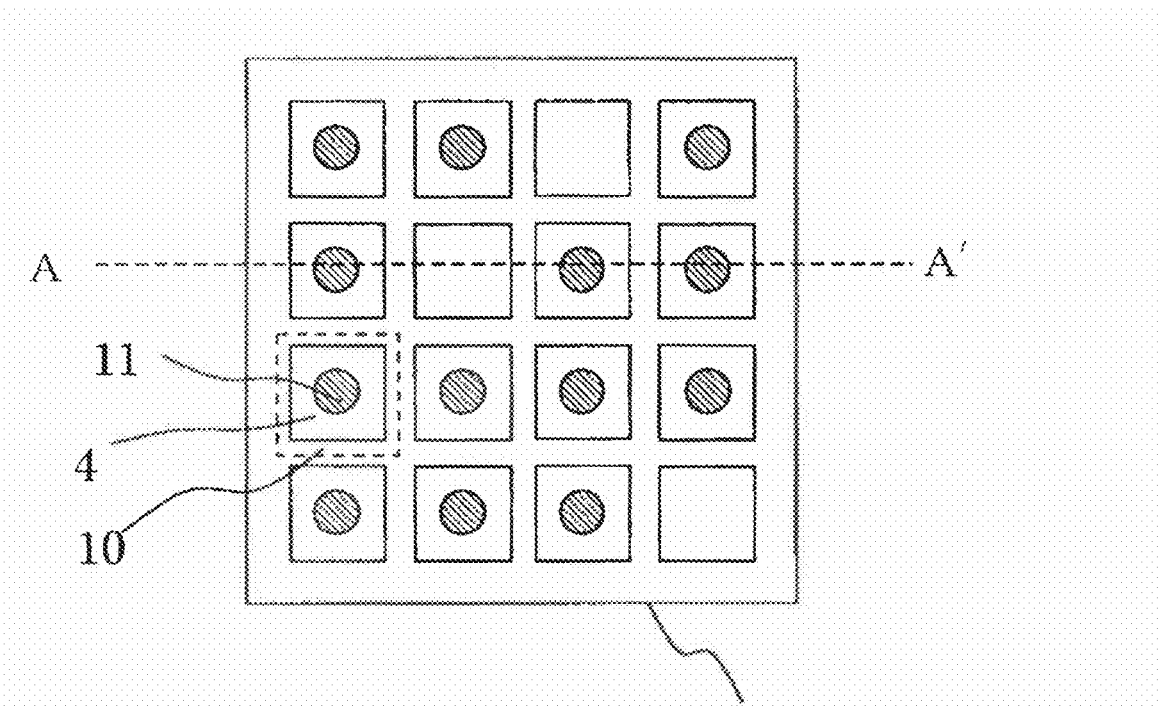
FIG. 2 is a plane view and a cross-sectional view illustrating an SiC chip according to the semiconductor device in Embodiment 1 of the present invention.
Figure 2B:
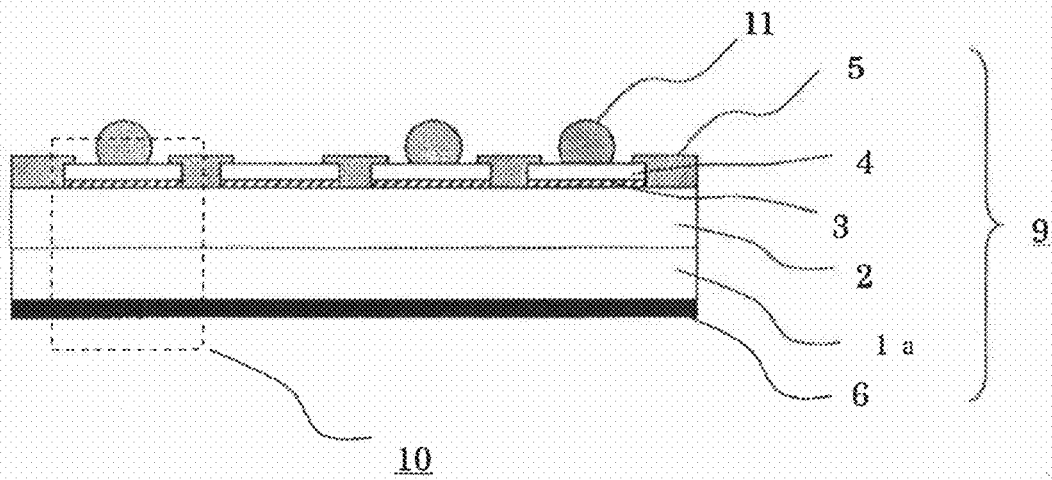

Using FIG. 2, a method is explained in which the units are arranged for the SiC wafer to attain a predetermined yield, where FIG. 2a is a plan view of the SiC chip 9 according to the semiconductor device of the embodiment, and FIG. 2b is a cross-sectional view along the line A-A' of FIG. 2a; here, an example is represented in which, making explanation simple, the units 10 are arranged in four by four. When a semiconductor device having current capacity of, for example, 100 A is manufactured, because current capacity per unit area of the Schottky barrier electrodes 3 of the SiC chip 9 is approximately 3 $A/mm^2$, a Schottky barrier area of approximately 6 square mm is needed. The defect density of the SiC wafer is assumed to be, for example, not more than $10/cm^2$, an attainable yield will be below 5% in the above area; therefore, mass-production becomes difficult. Here, each area of the Schottky barrier electrodes 3 of the units 10 according to this embodiment is set to a size in which a sufficient yield can be obtained. For example, even though the defect density is approximately $10/cm^2$, if the area of the Schottky barrier electrode 3 of the unit 10 is set at 1 mm square, the yield of not lower than 80% can be obtained; therefore, if a plurality of these units 10 is arranged on the SiC chip 9, non-defective units can be obtained with probability not lower than 80%. Here, as illustrated in FIG. 2a, when the units 10 are arranged in four by four, if the yield is 80%, approximately three units are calculated to be defective units. In the SiC chip 9 according to the embodiment, only on the external output electrodes 4 of the non-defective units, are formed the bumps 11 whose diameters each are from several dozen to several hundred μm, composed of the molten metal, while the units having no bumps 11 in FIG. 2 are the defective units.

Figure 3A:
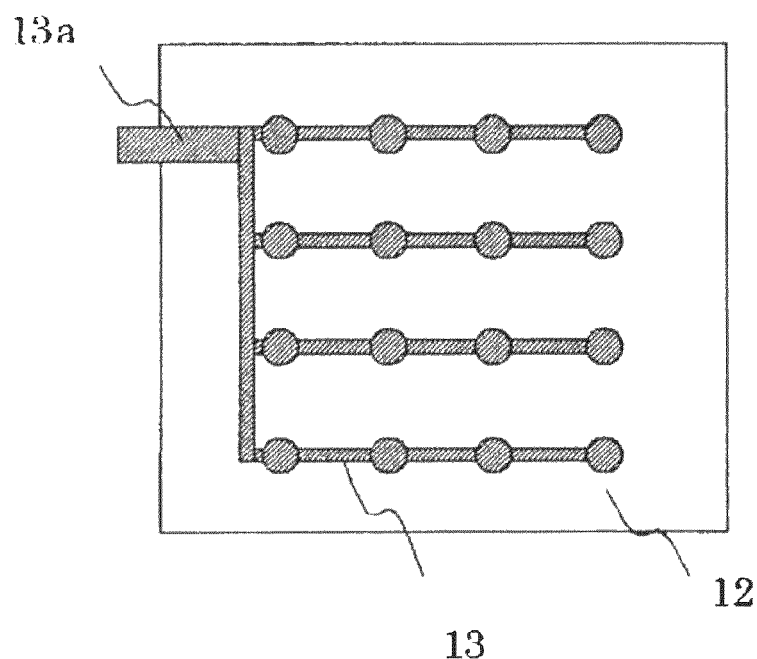
FIG. 3 is plane views illustrating a wiring substrate member according to the semiconductor device in Embodiment 1 of the present invention.
Figure 3B:
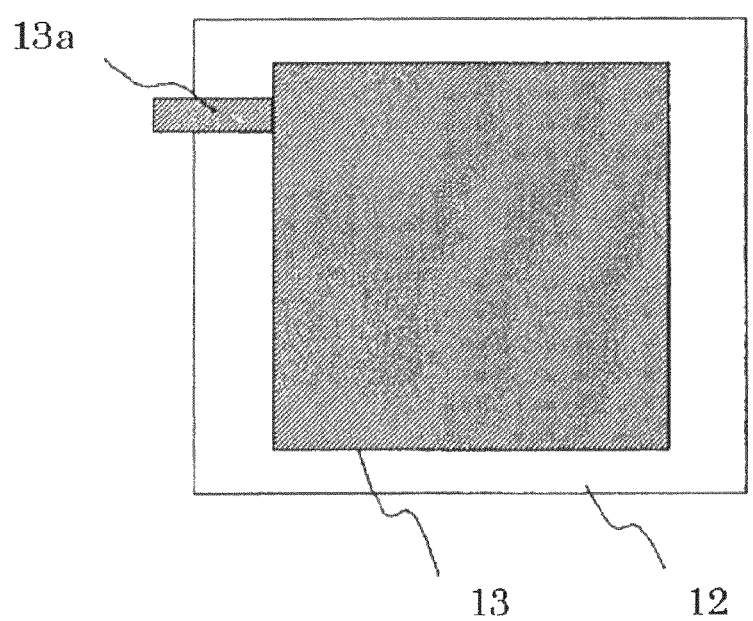

FIG. 3 is a plan view illustrating a wiring substrate member composed of a wiring substrate provided with a wiring layer according to the semiconductor device of the embodiment, and the member constitutes a semiconductor device, being connected with the SiC chip 9 on which the bumps 11 represented in FIG. 2 are formed. FIG. 3a represents a case in which the wiring layer 13 is formed, corresponding to at least a region where the bumps 11 are formed on the SiC chip 9, on the face of the wiring substrate 12 made of, for example, ceramics and resin, and in which the wiring layer 13 is connected to the external lead 13a. Because the wiring layer 13 and the external output electrodes 4 are electrically connected with each other by the bumps 11, only the electrodes of the non-defective units on which the bumps 11 are formed are connected in parallel with each other. Moreover, because the units 10 are arranged keeping an inter-unit space not shorter than 1 mm, in manufacturing semiconductor devices using silicon wafers, manufacturing equipment can be used, which is best optimized to form a pattern whose width is from several hundred μm to several mm, and thickness is from several dozen to several hundred μm, in the process of mounting silicon chips on wiring substrates; therefore, a pattern of the wiring layer 13 of the wiring substrate 12 according to this embodiment can be easily manufactured by using the above manufacturing equipment and forming technology, so that the wiring layer 13 can also be easily formed in a thickness of from several dozen to several hundred μm, which consequently enables wiring electrical resistance to be relatively low. Here, because the units 10 according to this embodiment are Schottky barrier diodes, and the output from the surface of the SiC chip 9 is only one kind, the wiring layer 13 may also be a simple pattern formed on the entire surface of the wiring substrate 12 as represented in FIG. 3b; thereby, manufacturing steps of the wiring substrate 12 can be simplified.

As described above, because in a semiconductor device according to this embodiment, an SiC wafer is used as a semiconductor wafer, the device is excellent in high-voltage, large-current, and high-temperature operational characteristics, and therefore can be used as an electric-power semiconductor device. The semiconductor device according to this embodiment can be obtained by connecting the SiC chip 9 with the wiring substrate member represented in FIG. 3; however, as described above, because the units provided on the SiC wafer have been set within such an area as a predetermined yield can be attained, bumps 11 have been formed only on the electrodes of non-defective units, and using these bumps 11, the external electrodes of the above non-defective units have been connected in parallel with each other through the wiring layer 13 provided on a wiring substrate other than the SiC chip 9, a semiconductor device having excellent characteristics can be obtained in high yield. Because the connection is performed by the bumps 11, it becomes possible to dissipate heat having generated in the SiC chip 9 not only to the package side but also to the wiring substrate side; consequently, higher-temperature operation as well as larger-current operation become possible. Moreover, as represented in FIG. 12, because neither the wiring layer 54 nor the insulating layer 51 is provided by direct deposition on an SiC chip, reliability of the semiconductor device improves because warpage of the SiC wafer and film stress due to thick-film can be prevented from generating; consequently, because the above depositing process is not needed, manufacturing the device becomes easy so that cost can be reduced. Furthermore, because by connecting the bumps 11 to the wiring substrate 12, the connection to the external lead can also be performed simultaneously, the mounting step becomes simple so that cost can be reduced.

If the wiring layer 13 is too near to the SiC chip 9, for example, discharging occurs on the separators between the units 10, and each separation withstand voltage is adversely affected; however, because the connection is performed by the bumps 11, the wiring layer 13 can be apart from the SiC chip 9 by a distance equivalent to the size of the bump 11 (the size from several dozen to several hundred μm, that is, the diameter of the bump 11), which can consequently easily realize withstand voltage higher than that of the conventional semiconductor device represented in FIG. 12. Moreover, withstand voltage of the units 10 can be prevented from decreasing, which occurred in the above conventional semiconductor device due to forming the metal layer 54 on the insulating layer 55 of the separators between the units. In the conventional semiconductor device illustrated in FIG. 12, an oxide film such as a PSG (phosphosilicate glass) film, having a thickness of approximately 1 μm, which has been deposited by the CVD (chemical vapor deposition) method is used as the insulating layer 55; however, because the breakdown voltage of the PSG film is approximately 2-6 MV/cm, the withstand voltage is 200-600 V; therefore, a semiconductor device whose rated voltage is in the order of kV cannot be realized. In order to manufacture a semiconductor device whose withstand voltage is 5 kV, the necessary insulating layer thickness becomes 8-25 μm; consequently, the deposition becomes difficult. On the other hand, in this embodiment, for example, if the mean thickness of the bumps 11 is made to be 100 μm, because the wiring layer 13 and the SiC chip 9 are apart 100 μm from each other, even though the withstand voltage of the protection film 5 and the underfill resin 19 is underestimated as approximately 1 MV/cm, the withstand voltage of 10 kV can be ensured; consequently, the semiconductor device according to this embodiment can have ten times to hundred times as high rated voltage as that of the conventional device.

In general, the wiring-layer resistance of an electric-power semiconductor device must be sufficiently low comparing to its ON resistance, and is desired to be not higher than 5 mΩ. In the metal layer of the conventional semiconductor device illustrated in FIG. 12, because semiconductor-device manufacturing equipment using the silicon wafer is optimized so as to enable a film to be deposited in not thicker than several μm, aluminum-group wiring material having a thickness of not thicker than several μm is usually used. Assuming the ratio between the length and width of the wiring to be 10:1, even though aluminum wiring is used, having a thickness of 3 μm, which is relatively thick compared to that used in semiconductor-device manufacturing equipment using a silicon wafer, because the aluminum-wiring specific resistance is approximately 3 μΩ·cm, the wiring resistance becomes 100 mΩ; therefore, in order to make resistance not higher than 5 mΩ, a thick film having a thickness of some 60 μm becomes necessary, which makes the deposition difficult. On the other hand, in this embodiment, because the wiring layer 13 of the wiring substrate 12 has been formed on the wiring substrate 12 other than the SiC chip 9, manufacturing process can be applied, in which silicon chips are mounted on a wiring substrate. Therefore, in manufacturing a semiconductor device according to this embodiment, equipment that is optimized to form a pattern whose width is from several hundreds of μm to several mm, and thickness is from several dozen to several hundred μm can be used, and copper can be used as the wiring layer. Because the resistance of the copper wiring is lower than that of aluminum wiring, and the specific resistance is approximately 1.8 μΩ·cm, assuming the ratio of the length and the width of the wiring to be 10:1, in order to make the resistance not higher than 5 mΩ, the copper wiring having a thickness of 36 μm becomes necessary; however, as described above, this thickness can be easily realized, and moreover, it is also easy to make the thickness of the wiring layer not thinner than several hundred μm. In this case, the wiring resistance can also be made not higher than 0.5 mΩ, and even if the ratio of the length and the width of the wiring is set at 100:1, because the resistance becomes not higher than 5 mΩ, more units can be connected in parallel with each other. As described above, in a semiconductor device according to this embodiment, because copper wiring whose wiring resistance is relatively low is used, and wiring having sufficient thickness can be obtained, current capacity can be made 20-200 times as large as that of the conventional device.

Embodiment 2

FIG. 4 is an explanatory view illustrating a step of forming bumps on the SiC wafer 1a as the semiconductor wafer, according to a method of manufacturing a semiconductor device in Embodiment 2 of the present invention, in which data of a wafer test for determining whether the units 10 formed on the SiC wafer 1a are good or no good (hereinafter referred to as simply a wafer test) is transmitted to a controller 21 of a solder shooter, and the bumps 11 composed of molten metal are selectively formed, using the solder shooter, only on the external output electrodes 4 of the non-defective units.

Figure 4A:
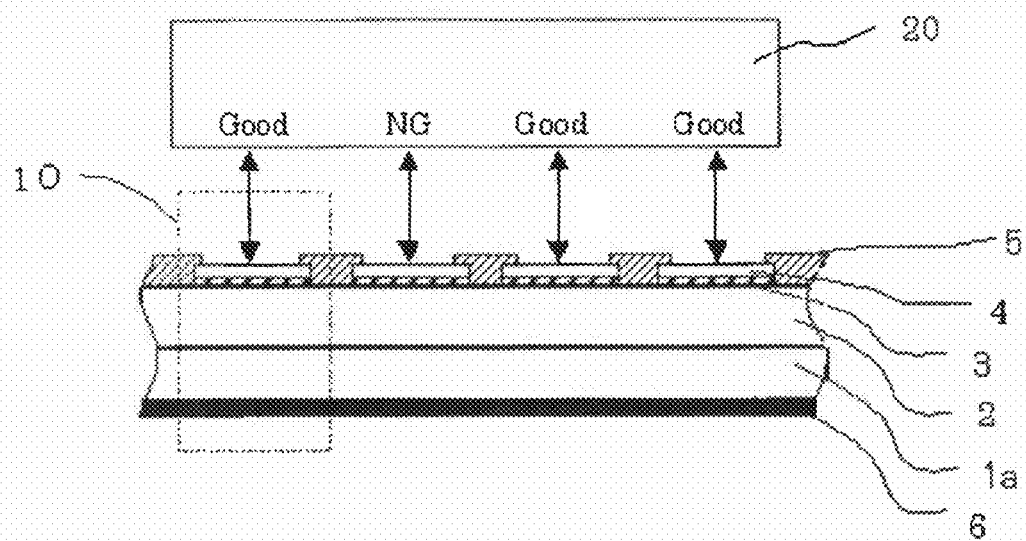
FIG. 4 is views explaining steps of forming bumps associated with a method of manufacturing a semiconductor device according to Embodiment 2 of the present invention.

That is, the wafer test is carried out using a wafer tester 20, in which by connecting the back face electrode 6 of the SiC wafer 1a with the stage (not illustrated) of the wafer tester 20, and electrically connecting to the external output electrode 4 of each unit 10 using a probe, etc., the check is performed whether each of the units 10 is good or no good (FIG. 4a). Next, the bumps 11 are formed using a device that drips the molten metal (hereinafter referred to as a "solder shooter"); here, the solder shooter is a device, operating similar to an ink-jet-type printer, for dripping on a predetermined position a liquid droplet of the molten metal instead of the ink of the printer, and the bumps 11 are formed using the solder shooter, based on the wafer-test data obtained by the wafer tester 20.

Figure 4B:
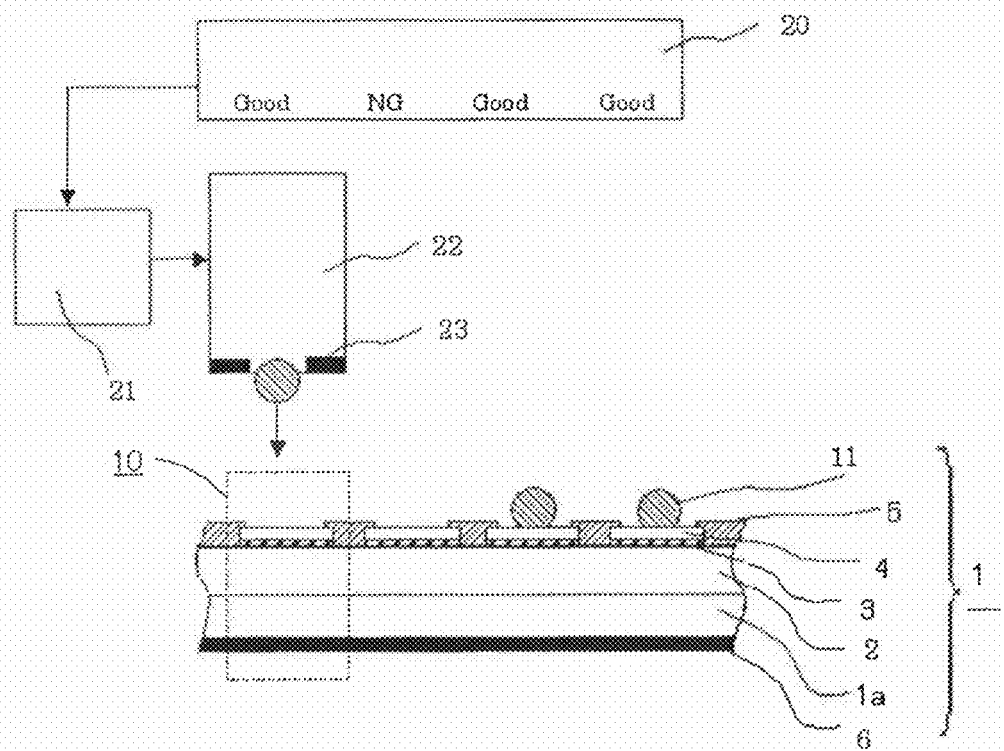

That is, by applying pulses, based on the wafer-test data, from the controller 21 to a piezoelectric element provided in a molten-metal bath included in a head 22 of the solder shooter, liquid droplets of the molten metal are dripped from a nozzle 23 of the head 22 to the external output electrodes 4 of the non-defective units 10. The mean diameter of the droplets is determined by the pulse signal and the nozzle diameter, particles having a mean diameter of several dozen-several hundred μm can be formed, and molten-metal bumps are formed on the SiC wafer 1a by dripping the molten-metal particles after the SiC wafer 1a has been positioned apart from the head 22 several mm. That is, similar to a case in which printing is carried out using the ink-jet type printer, after the head 22 has been moved to a bump-forming position of the SiC wafer by the controller, by applying pulses to the piezoelectric element in order to drip the liquid droplets, the bump 11 is formed in a desired position (FIG. 4b). Here, because the molten metal fits into well when a thin Au film, etc. is deposited on the external output electrodes on which the bumps are formed, the external output electrodes are in some cases made of Al, for example, Cr—Ni—Au may be deposited. The shape of the bumps 11 depends on the temperature of the SiC wafer 1a; for example, the liquid droplet of the molten metal solidifies soon after contacting the SiC wafer 1a at room temperature, and then a spherical or semi-spherical bump is formed. Here, if the temperature of the SiC wafer 1a is increased by some degrees, up to near the melting point of the molten metal, the metal layer can also spread over the whole area of the external output electrode of the unit. Because a plurality of liquid droplets can also be dripped in a same position, if a sufficient amount of the molten-metal particle is dripped to an area of the external output electrode, a hill-shaped bump spreading over the whole area of the external output electrode can also be formed. As represented in this embodiment, when the wafer-test data is used, and equipment such as a solder shooter that can form bumps on the electrodes of non-defective units is used, because neither deposition nor processing of the bump material is needed, manufacturing process becomes simple so that cost can be reduced.

Figure 5:
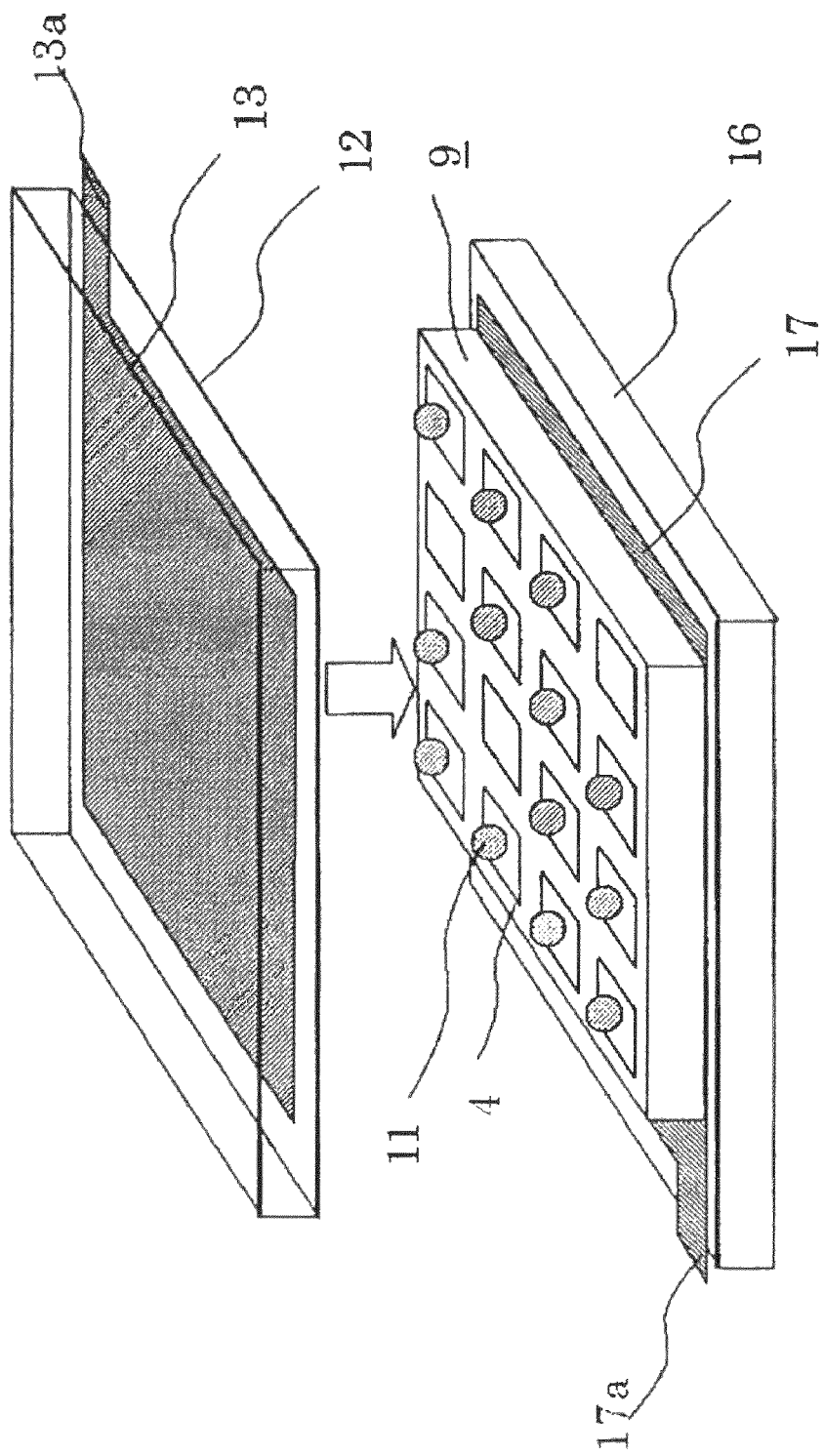
FIG. 5 is a perspective view explaining a step of connecting electrodes to a wiring layer in the method of manufacturing the semiconductor device according to Embodiment 2 of the present invention.

As described above, an SiC-wafer member has been obtained by forming bumps only on the external output electrodes 4 of non-defective units, and segmented into the SiC chips 9 having a plurality of the units 10; then, the electrodes are connected to the wiring layer 13, due to melting of the bumps 11, by heating and cooling of the bumps, as represented in FIG. 5, after the bumps 11 on the SiC chip 9 are positioned so as to be overlapped on the wiring layer 13 provided on the wiring substrate 12. FIG. 5 is a perspective view explaining a connection step of a wiring layer, according to a method of manufacturing a semiconductor device in this embodiment.

Here, as represented in FIG. 1, the underfill resin 19 is used in order to fix the SiC chip 9 and improve the reliability of the bump connecting portion; however, the resin may be injected between the SiC chip 9 and the wiring substrate 12 after the bumps 11 are connected, or may be applied on the chip before the connection. When the SiC chip 9 is fixed to the package substrate 16, in order to prevent the bumps 11 from melting due to too high heating temperature or too long heating duration, metal having higher melting point than that of the metal used as the die-bonding material 18 is used as the bumps 11. Moreover, when the molten-metal die-bonding material 18 for connecting the back face electrode 6 with the wiring layer 17 of the package substrate 16 is not completely solidified, but temporarily fixed and then the bumps 11 and the wiring layer 13 are connected with each other by heating after the wiring substrate 12 is mounted on the SiC chip 9, the die-bonding material 18 that is back-face molten-metal paste may be solidified. Furthermore, the size of each aperture of the protection film 5 may be made to be approximately the same final size as the bump of the external output electrodes 4, so as to confine the metal within the aperture even if the molten metal melts. For example, if the aperture diameter is set at 100 μm, and a molten-metal particle having a diameter of approximately 80 μm is placed on the electrode, when the die-bonding material 18 that is the back-face molten-metal paste is solidified, the molten-metal particle on the external output electrode 4 also melts; consequently, a semi-spherical bump is formed on the aperture. Moreover, in order to fix the SiC chip 9, electrically conductive die-bonding material (for example, a conductive adhesive in which conductive filler such as silver filler is admixed with a resin adhesive) may be used.

Embodiment 3

Figure 6:
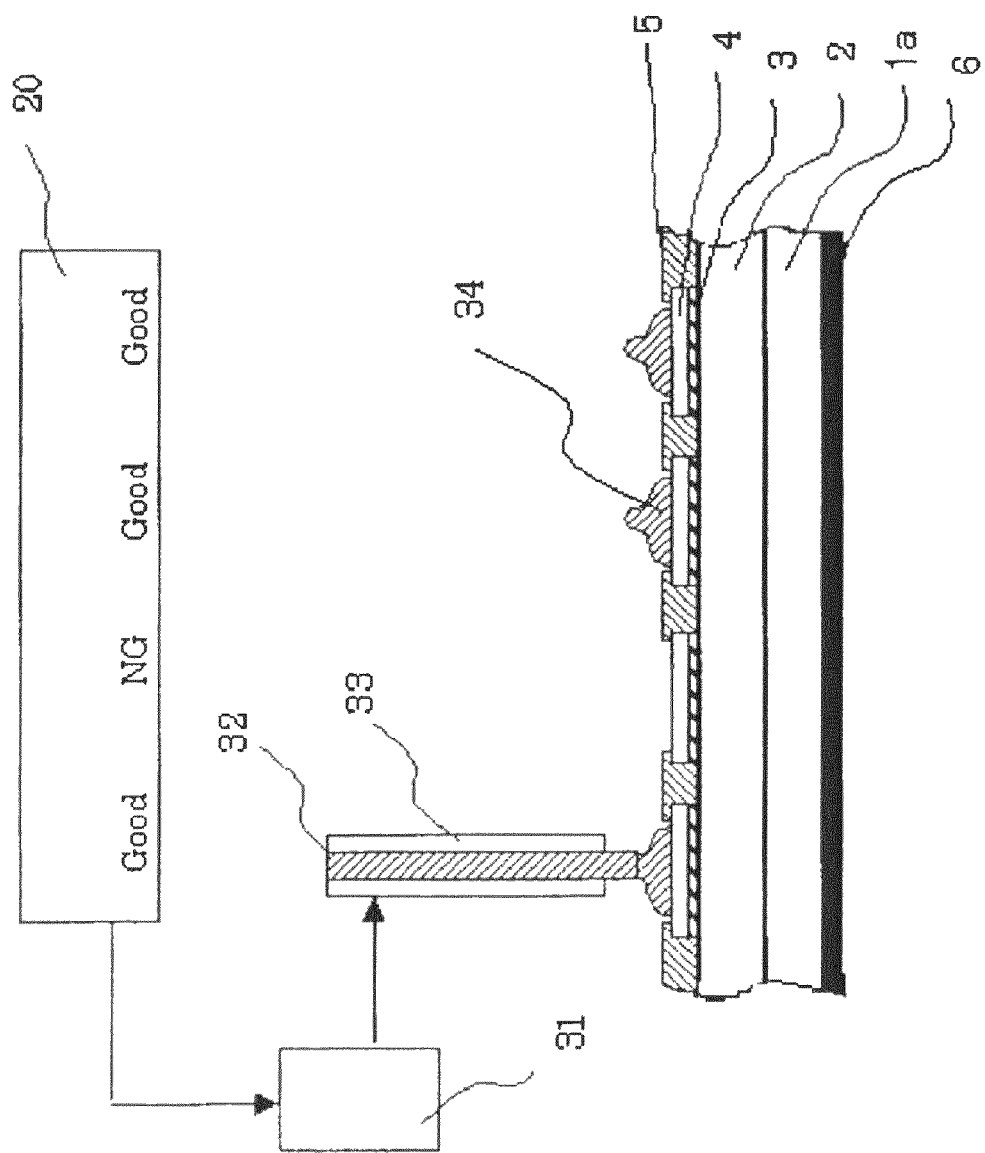
FIG. 6 is a view explaining a step of forming bumps associated with a method of manufacturing a semiconductor device according to Embodiment 3 of the present invention.

A method of manufacturing a semiconductor device according to Embodiment 3 of the present invention is similar to that in Embodiment 2 except for the bumps being formed by a ball bonder instead of the bumps having been formed by the solder shooter; here, FIG. 6 is a view explaining a bump forming process according to the manufacturing method for a semiconductor device of this embodiment. For example, in a step in which gold bumps 34 are formed by a gold ball bonder, based on wafer-test data by the wafer tester 20, a gold wire 32 is pressed and fixed, using a capillary 33, only to each of the external output electrodes 4 of the non-defective units by a controller 31, and then the wire 32 is cut off, thereby, the gold bumps 34 are formed. Here, the SiC wafer 1a is, for example, heated up to approximately 100° C., and in some cases, not only the capillary is pressurized but also ultrasonic waves are applied thereto. Thereby, because the bumps can be selectively formed, based on the wafer-test data, only on the non-defective units, deposition or processing of the bump material are not needed; therefore, the process becomes simple and cost can be reduced.

Embodiment 4

Figure 7A:
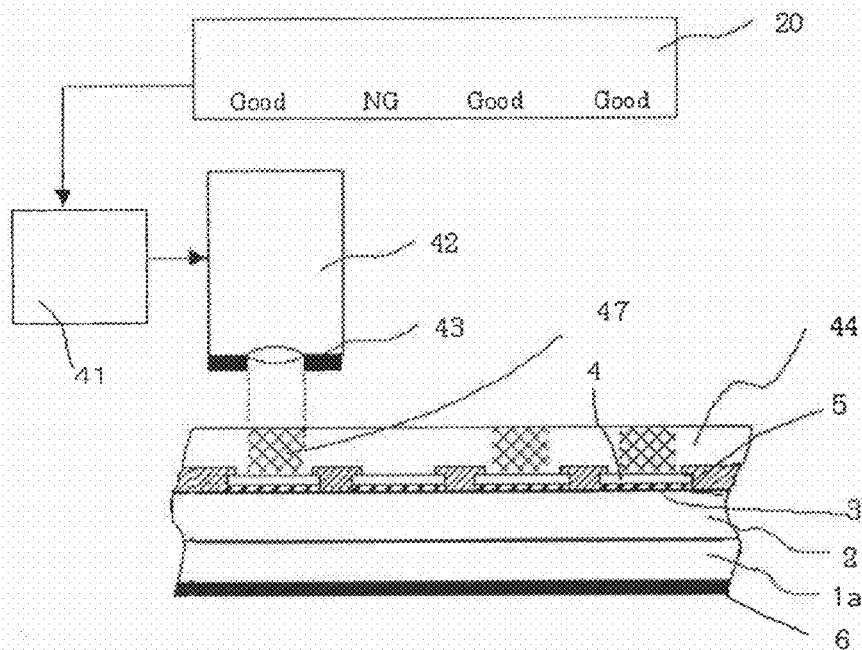
FIG. 7 is views explaining steps of forming bumps associated with a method of manufacturing a semiconductor device according to Embodiment 4 of the present invention.
Figure 7B:
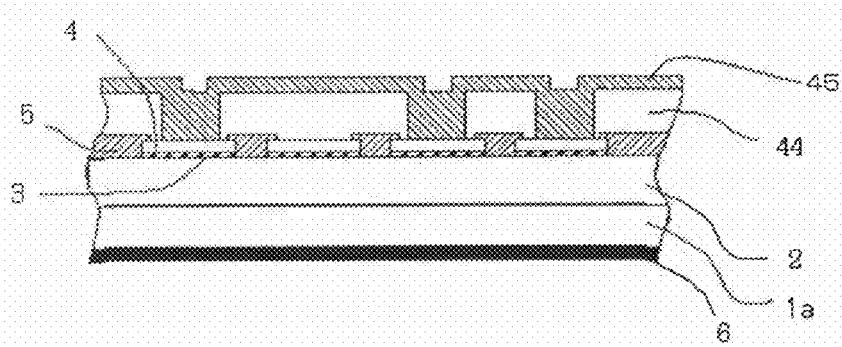
Figure 7C:
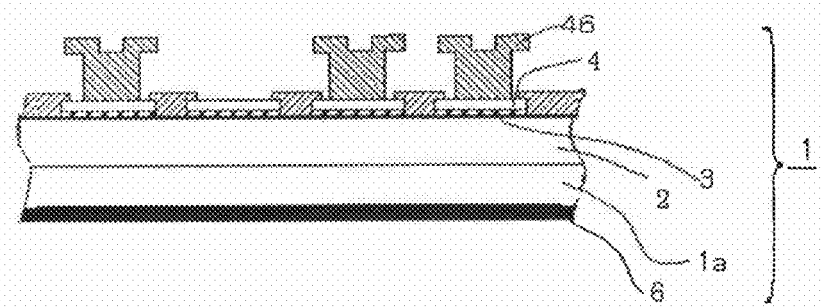

A method of manufacturing a semiconductor device according to Embodiment 4 of the present invention is similar to that in Embodiment 2 except for the bumps being selectively formed on the non-defective-unit electrodes of the SiC wafer using the photoengraving technology instead of the bumps having been formed by the solder shooter; here, FIG. 7 is a view explaining a bump forming process according to a manufacturing method for a semiconductor device of Embodiment 4. In the bump forming process according to the semiconductor device of this embodiment, the head, having the molten-metal bath, in the solder shooter is replaced with an exposure head 42 and used. The exposure head 42 can radiate spot light whose diameter is from ten to several hundred μm, in which, regarding the structure, for example, light is introduced from a UV-lamp light source such as a halogen lamp to the exposure head 42 through an optical fiber, and ON/OFF operation of the exposure is enabled by providing a shutter 43 at the light exiting end of the optical fiber. Photo-reactive resin 44 such as photoresist has been applied on the SiC wafer after the wafer test; thus, based on the wafer-test data, when the exposure head 42 is positioned over each of the external output electrodes 4 of the non-defective units, a controller 41 sequentially outputs ON signals to the shutter 43, and the photo-reactive resin 44 on the non-defective units is photo-reacted; consequently, photo-reacted portions 47 are obtained (FIG. 7a). When positive-type photoresist is used as the photo-reactive resin 44, the photo-reacted portions 47 open after developing the resist; then, a molten-metal film 45 is deposited, by a method such as the vacuum evaporation, on the photo-reactive resin 44 having apertures corresponding only to the external output electrodes 4 of the non-defective units (FIG. 7b). Next, the photo-reactive resin 44 is removed using organic solvent, etc., and thus, bumps 46 can be formed only on the external output electrodes 4 of the non-defective units (FIG. 7c).

In the photoengraving technology, in a case in which photo-reactive resist is developed by exposing light using a mask, and a mask pattern is transferred to the resist, the mask is made corresponding to a wafer test result; however, because each distribution of non-defective units differs from wafer to wafer, it is not practical that the mask be made corresponding to each wafer. Moreover, if a direct drawing system using such as an electron beam is used, it is easy to change an exposure pattern for each wafer based on a wafer test result; however, because such a system is expensive, which resultantly increases running cost. On the other hand, in this embodiment, because the needed mean diameter of the bumps is from several dozen to several hundred μm, such resolution as that in the above photoengraving technology using the mask or the direct drawing system is not needed; therefore, as this embodiment, because the bumps can be formed by using a modified solder shooter, equipment investment is generally small.

Figure 8A:
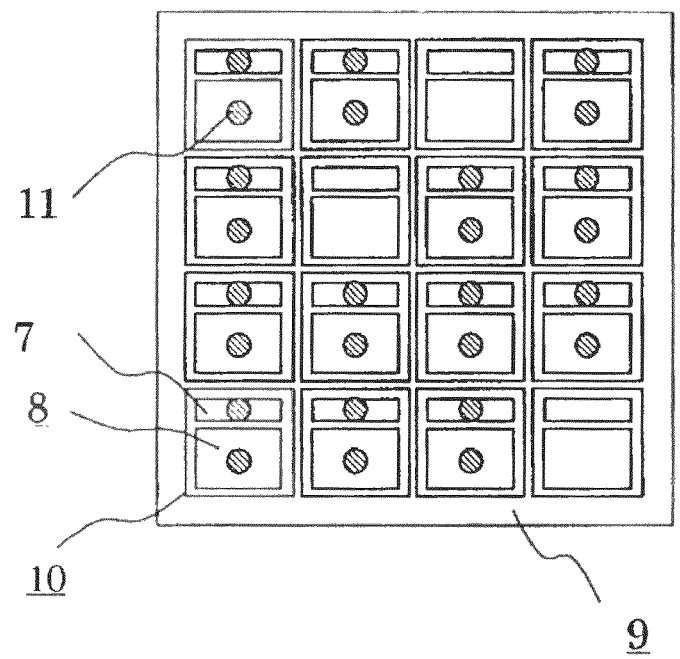
FIG. 8 is a plane view illustrating an SiC chip and a plane view illustrating a wiring substrate member connected to the SiC chip, according to a semiconductor device in Embodiment 5 of the present invention.

A semiconductor device according to Embodiment 5 of the present invention is similar to that in Embodiment 1 except that SiC vertical MOSFET semiconductor devices are formed, as semiconductor units 10 according to a semiconductor device in Embodiment 1, instead of electric power elements of the SiC Schottky barrier diodes. FIG. 8a is a plane view illustrating the SiC chip 9 according to a semiconductor device in Embodiment 5 of the present invention, which represents, as an example of the units 10, the SiC vertical MOSFET semiconductor devices being arranged in four by four, similar to Embodiment 1. That is, in a case of the vertical MOSFET devices, external output electrodes 7 as gate electrodes and external output electrodes 8 as source electrodes are provided on the front face side of the SiC chip 9, while the drain electrode is provided on the back face thereof. The bumps 11 are formed only on the external output electrodes 7, as the gate electrodes, and the external output electrodes 8, as the source electrodes, of the non-defective units; here, in FIG. 8a, units having no bumps 11 are defective units.

Figure 8B:
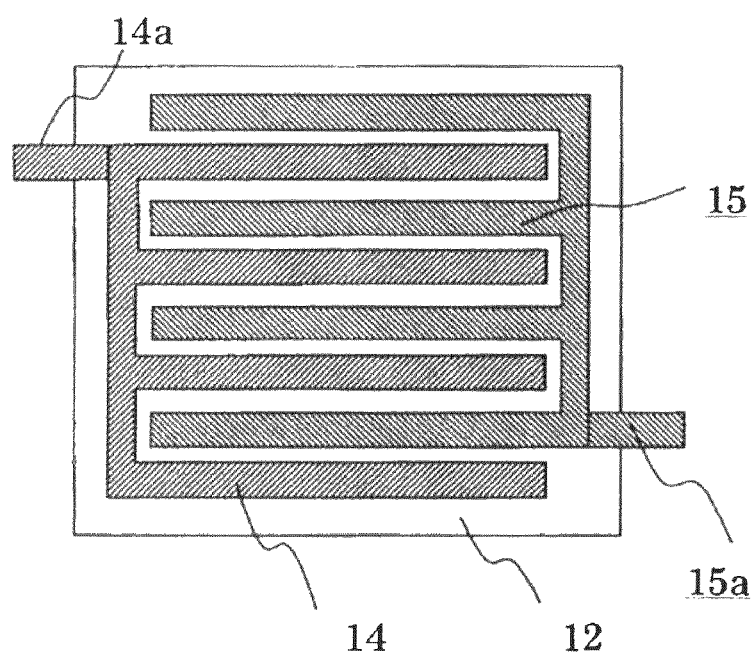

FIG. 8b is a plane view illustrating a wiring substrate member connected to the SiC chip 9 represented in FIG. 8a, in which a wiring layer 14 is formed, on the front face of the wiring substrate 12 composed of ceramics or resin, in a comb-shaped pattern corresponding to the arranging intervals of the bumps 11 on the external output electrodes 8, as the source electrodes, of the SiC chip 9, the wiring layer 14 is connected to an external lead 14a, and a wiring layer 15 is formed in a comb-shaped pattern corresponding to the arranging intervals of the bumps 11 on the external output electrodes 7, as the gate electrodes, of the SiC chip 9. The wiring layer 15 is connected to an external lead 15a, and the arranging intervals of the wiring layer 15 are equal to those of each unit and are not narrower than 1 mm; meanwhile, in manufacturing of semiconductor devices using silicon wafers, equipment is generally used that is most optimized to forming a pattern whose width is from several hundred μm to several mm, and whose thickness is from several dozen to several hundred μm, in the process of mounting the silicon chips on the wiring substrate; therefore, by the above manufacturing equipment and forming technology, the wiring layers 14 and 15 can be easily formed with the thickness of several dozen-several hundred μm, and the external leads 14a and 15a can also be integrally formed. By stacking the wiring substrate 12 on the SiC chip 9, and electrically connecting the wiring layers 14 and 15 with the bumps 11, the external leads 14a and 15a are electrically connected to the source electrodes and the gate electrodes of the units 10, respectively.

Figure 9:
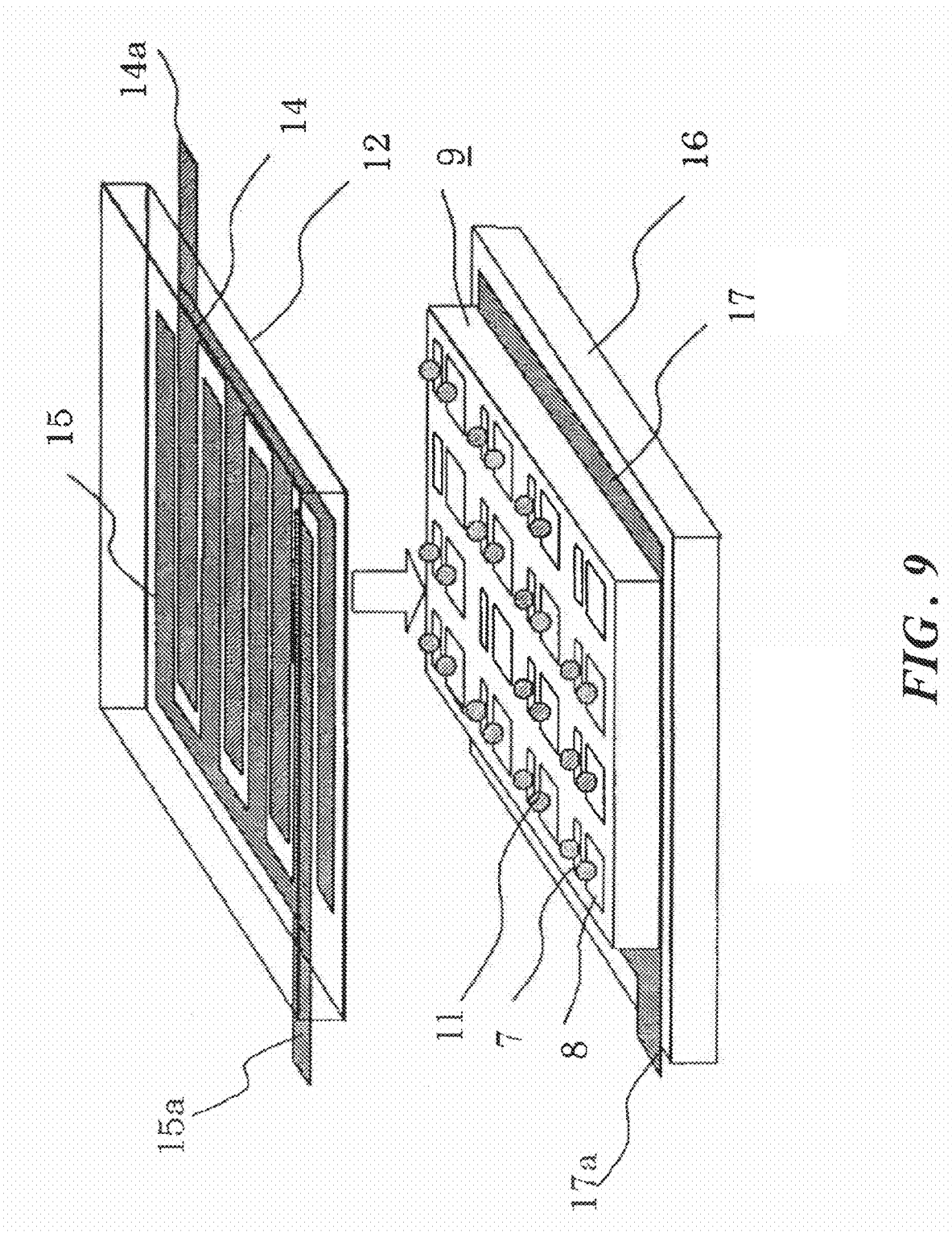
FIG. 9 is a perspective view explaining a mounting structure of the SiC chip and the wiring substrate member, according to the semiconductor device in Embodiment 5 of the present invention.

FIG. 9 is a perspective view explaining a mounting structure of the SiC chip 9 and the wiring substrate member, in which on the front face of the package substrate 16 is formed the wiring layer 17 that not only fixes the SiC chip 9 but also electrically connects to the back face electrode. The wiring layer 17 is connected to the external lead 17a. The drain electrode of the units is connected to the exterior thereof from the back face electrode of the chip 9 through the wiring layer 17 and the external lead 17a of the package substrate 16, the source electrodes are connected to the exterior from the bumps 11 through the wiring layer 14 and the external lead 14a of the wiring substrate 12, and the gate electrodes are connected to the exterior from the bumps 11 through the wiring layer 15 and the external lead 15a of the wiring substrate 13. Because the bumps 11 are not formed on the defective units, only the source electrodes and the gate electrodes of the non-defective units are respectively connected in parallel each other.

In a semiconductor device according to this embodiment, although effects similar to those in Embodiment 1 can be obtained, particularly, because each of the wiring layers 14 and 15 can be formed with a sufficient thickness using copper whose electrical resistance is relatively low, the wiring resistance can be easily reduced, and current capacity can be made 20-200 times as large as that of the conventional one; therefore, further effects described below can also be obtained. That is, in the SiC vertical MOSFET semiconductor device according to this embodiment, as illustrated in FIG. 8 and FIG. 9, because the external output electrodes 7 as the source electrodes and the external output electrodes 8 as the gate electrodes are separated and connected in parallel with each other, the wiring layers 14 and 15 placed apart from each other are needed corresponding to the external output electrodes 7 as the source electrodes and the external output electrodes 8 as the gate electrodes, and the length of each wiring layer becomes longer with respect to the width thereof, therefore, an effect enabling the wiring resistance to reduce as described above becomes remarkable.

Embodiment 6

Figure 10A:
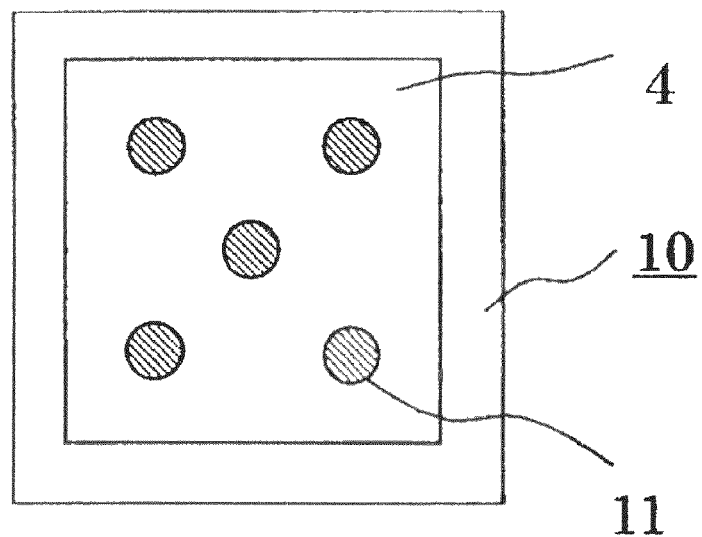
FIG. 10 is plane views illustrating installation states of bumps on a semiconductor unit formed on an SiC chip according to a semiconductor device in Embodiment 6 of the present invention.
Figure 10B:
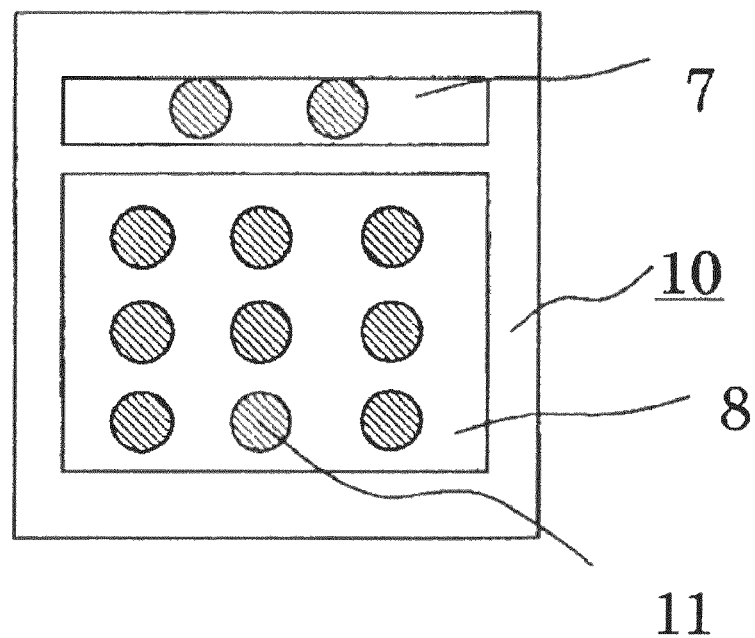

Embodiment 6 according to the present invention represents a semiconductor device similar to that in Embodiment 1 or in Embodiment 5, except for the installation state of the bumps in Embodiment 1 or in Embodiment 5 being as in FIG. 10. Here, FIG. 10 is plane views illustrating installation states of bumps on a unit formed on the SiC chip 9, according to the semiconductor device in Embodiment 6 of the present invention. FIG. 10a illustrates a case in which the unit 10 has one kind of external output electrode 4 on the front face thereof as the Schottky barrier diode, while FIG. 10b illustrates a case in which the unit 10 has two kinds of external output electrodes 7 and 8 on the front face thereof as the SiC vertical MOSFET semiconductor device; that is, although, in Embodiments 1-5, examples are represented in which a bump is arranged on each of the external output electrodes of the units, another case is represented in which a plurality of bumps is arranged in this embodiment. By forming the plurality of bumps 11 on the external output electrodes 4, and connecting the plurality of bumps with each other effects are brought about in that not only connection resistance is decreased, but also the stress of the bump connection portion is relaxed. Moreover, as illustrated in FIG. 10b, in the SiC vertical MOSFET semiconductor device, the connection resistance can also be decreased by increasing the number of the bumps on the external output electrode of the source electrodes that can flow current more than that of the external output electrodes 7 of the gate electrodes that cannot flow current.

Embodiment 7

Figure 11A:
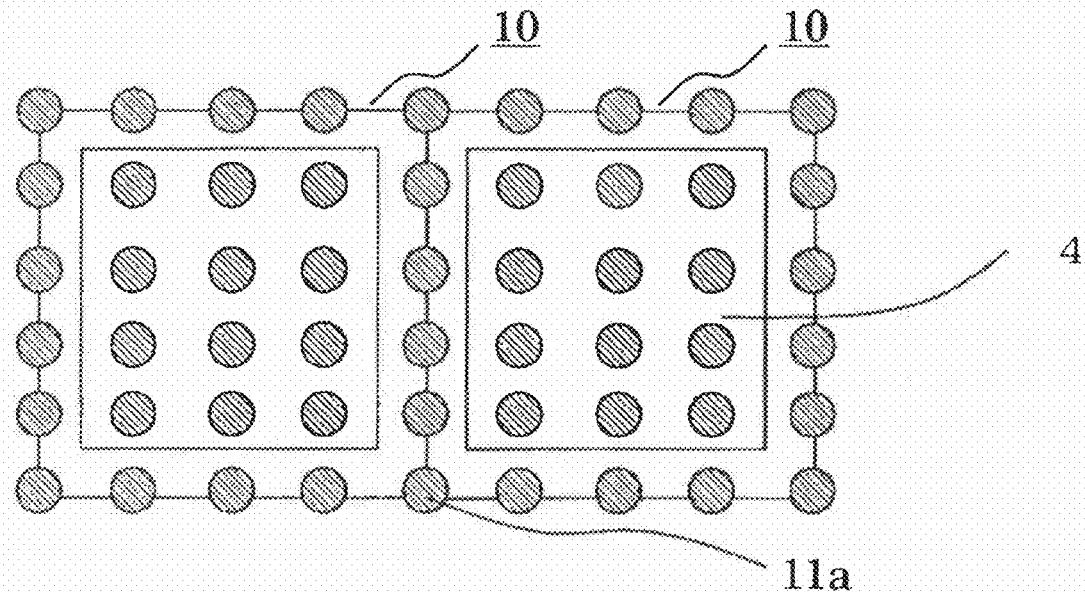
FIG. 11 is plane views illustrating installation states of bumps on a semiconductor unit formed on an SiC chip according to a semiconductor device in Embodiment 7 of the present invention.
Figure 11B:
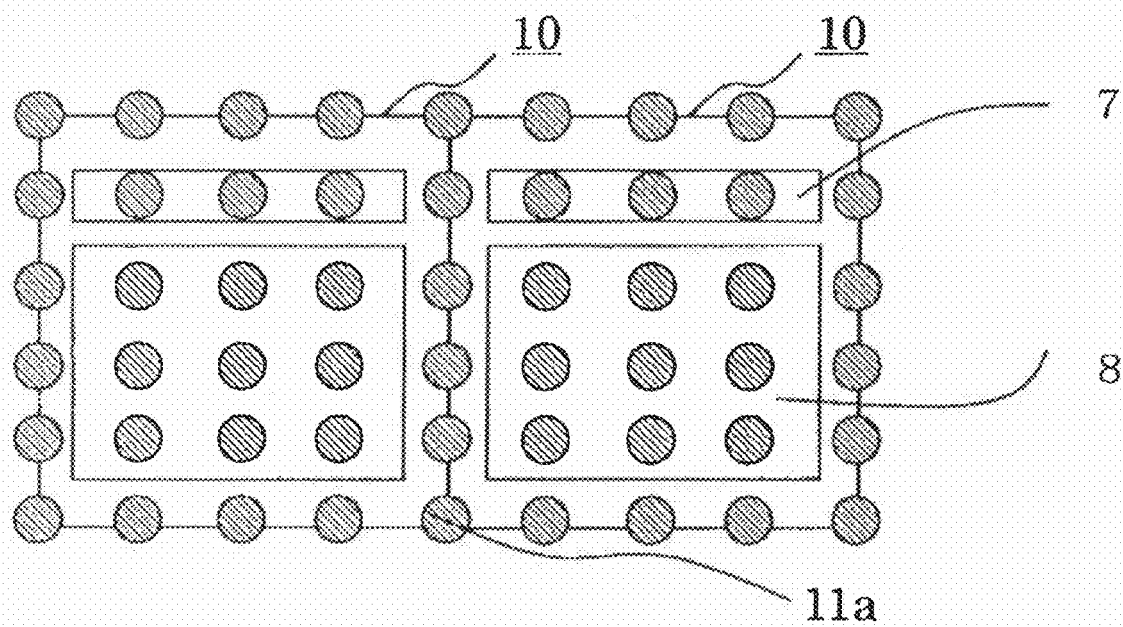

Embodiment 7 according to the present invention represents a semiconductor device similar to that in Embodiment 1 or in Embodiment 5, except for arrangement states of the bumps in Embodiment 1 or in Embodiment 5 being as in FIG. 11. Here, FIG. 11 is plane views illustrating arrangement states of bumps on units formed on the SiC chip 9, according to the semiconductor device in Embodiment 6 of the present invention. FIG. 11a illustrates a case in which the units 10 have one kind of external output electrode 4 on the front face thereof as the Schottky barrier diodes, while FIG. 11b illustrates a case in which the units 10 have two kinds of external output electrodes 7 and 8 on the front face thereof as the SiC vertical MOSFET semiconductor device; that is, although, in Embodiments 1-6, examples in which bump are formed on the external output electrodes of the non-defective units are represented, a case is represented in which dummy bumps 11a whose objective is not to connect the external output electrodes with the wiring layers of the units are formed on a region other than the external output electrodes 4 of the SiC chip. In this embodiment, by the dummy bumps 11a, heat generated in the SiC chip can be effectively dissipated to the wiring substrate side, and the stress of the bumps 11 for electrical connection can also be relaxed by arrangement of the dummy bumps 11a. Because the dummy bumps 11a are not electrically connected to the external output electrodes of the units, the dummy bumps may be connected to the wiring layers 14 and 15. Alternatively, an electrode pad that is electrically separated from the wiring layers 14 and 15 may be provided in a position facing the dummy bumps 11a on the wiring substrate, and may be connected to the dummy bumps 11a. Here, although the dummy bumps have been arranged between the units as described above, the dummy bumps may also be arranged outside the unit allay (the periphery of the chips).

What is claimed is:

1. A method of manufacturing a semiconductor device, the method comprising:

forming semiconductor units on a semiconductor wafer, the semiconductor units being Schottky diodes fabricated using an SiC wafer, or being MOSFET semiconductor devices fabricated using the same;

determining whether each of the semiconductor units is defective or non-defective;

selectively forming bumps on external output electrodes of, among the non-defective and defective semiconductor units, the non-defective semiconductor units, to obtain a semiconductor wafer member;

segmenting the semiconductor wafer member to obtain a semiconductor chip having a plurality of the semiconductor units; and electrically connecting the bumps with a wiring layer provided on a wiring substrate, a gap between the wiring layer and the external output electrodes being several dozen to several hundred micrometers.

2. A method of manufacturing a semiconductor device as recited in claim 1, wherein in the bump forming, the bumps are formed selectively, based on test results determining whether each of the semiconductor units is defective or non-defective, by dripping molten metal onto the external output electrodes of the non-defective semiconductor units.

3. A method of manufacturing a semiconductor device as recited in claim 1, wherein in the bump forming, the bumps are formed with a bump bonder selectively, based on test results determining whether each of the semiconductor units is defective or non-defective, onto the external output electrodes of the non-defective semiconductor units.

4. A method of manufacturing a semiconductor device as recited in claim 1, wherein the bump forming includes, based on test results of determining whether each of the semiconductor units is defective or non-defective:

selectively and sequentially exposing, for a photo-reactive resin layer provided on the semiconductor wafer, the photo-reactive resin layer to light so as to form apertures on the external output electrodes of the non-defective semiconductor units; and forming bumps in the apertures, so as to selectively form the bumps onto the external output electrodes of the non-defective semiconductor units.

5. A method of manufacturing a semiconductor device as recited in claim 1, wherein the forming the semiconductor units further comprises forming the semiconductor units on the semiconductor wafer with an inter-unit spacing of not less than 1 millimeter.

6. A method of manufacturing a semiconductor device as recited in claim 1, wherein the selectively forming bumps comprises selectively forming a plurality of bumps on each of the external output electrodes of the non-defective semiconductor units.

7. A method of manufacturing a semiconductor device as recited in claim 1, wherein the selectively forming bumps comprises forming a dummy bump on at least one of the semiconductor units, the dummy bump not being electrically connected to the external output electrode of the at least one of semiconductor units.

8. A method of manufacturing a semiconductor device as recited in claim 1, wherein the electrically connecting comprises electrically connecting the bumps with a copper wiring layer provided on the wiring substrate.

* * * * *